(12) United States Patent
Giallorenzi et al.

(10) Patent No.: US 8,786,939 B1
(45) Date of Patent: Jul. 22, 2014

(54) SPECTRAL SENSING DEMODULATOR

(71) Applicant: L-3 Communications Corp., New York, NY (US)

(72) Inventors: Thomas R. Giallorenzi, Riverton, UT (US); Samuel C. Kingston, Salt Lake City, UT (US); Robert G. Rebolledo, Park City, UT (US); Osama S. Haddadin, Salt Lake City, UT (US)

(73) Assignee: L-3 Communications Corp., New York, NY (US)

( * ) Notice: Subject to any disclaimer, the term of this patent is extended or adjusted under 35 U.S.C. 154(b) by 0 days.

(21) Appl. No.: 14/152,408

(22) Filed: Jan. 10, 2014

Related U.S. Application Data

(62) Division of application No. 13/162,902, filed on Jun. 17, 2011, now Pat. No. 8,659,820.

(51) Int. Cl.
*G02F 2/00* (2006.01)
(52) U.S. Cl.
USPC ............................. 359/325; 375/150; 398/147
(58) Field of Classification Search
CPC ........................................................ G02F 2/00
USPC ............................. 359/325; 375/150; 398/147
See application file for complete search history.

(56) References Cited

U.S. PATENT DOCUMENTS

| | | | |
|---|---|---|---|
| 5,200,796 A | 4/1993 | Lequime | |
| 5,452,327 A | 9/1995 | Barham et al. | |
| 6,154,483 A | 11/2000 | Davidovici et al. | |
| 6,721,371 B1 * | 4/2004 | Barham et al. | 375/316 |
| 6,898,176 B1 | 5/2005 | Cruickshank et al. | |
| 7,424,268 B2 | 9/2008 | Diener et al. | |
| 7,650,126 B2 | 1/2010 | Birru et al. | |
| 7,710,919 B2 | 5/2010 | Woo et al. | |
| 7,715,343 B2 | 5/2010 | Tomioka | |
| 8,659,820 B1 * | 2/2014 | Giallorenzi et al. | 359/325 |
| 2002/0172170 A1 | 11/2002 | Muhammad et al. | |
| 2008/0186887 A1 | 8/2008 | Chapyzhenka et al. | |

OTHER PUBLICATIONS

U.S. Appl. No. 13/162,902, filed Jun. 17, 2011, Giallorenzi et al.
Barnwell et al., "Filter Banks for Analysis-Reconstruction Systems: A Tutorial," IEEE Xplore (1990), 5 pages.
Vaidyanathan, "Multirate Digital Filters, Filter Banks, Polyphase Networks, and Applications: A Tutorial," Proceedings of the IEEE, vol. 78, No. 1 (Jan. 1990), pp. 56-93.
Esteban et al., "HQMF: Halfband Quadrature Mirror Filters," IEEE Xplore (1981), pp. 220-223.

* cited by examiner

*Primary Examiner* — Daniel Petkovsek
(74) *Attorney, Agent, or Firm* — Kirton McConkie

(57) ABSTRACT

A spectral sensing demodulator can include a programmable filter bank and a reconfigurable processor coupled to the programmable filter bank. The programmable filter bank can frequency demultiplex a plurality of frequency division multiplexed channels from a frequency band into a plurality of demultiplexed channels. The reconfigurable processor can include a plurality of reconfigurable resources. Each resource can be alternatively be configured to demodulate a demultiplexed channel and to monitor a demultiplexed channel.

20 Claims, 7 Drawing Sheets

SPECTRAL SENSING DEMODULATOR

CROSS REFERENCE TO RELATED APPLICATION(S)

This application is a division of U.S. patent application Ser. No. 13/162,902 (filed Jun. 17, 2011) (pending), which is incorporated by reference herein in its entirety.

FIELD

The present application relates to wireless communications. More particularly, the present application relates to a spectral sensing demodulator.

BACKGROUND

Wireless communications is becoming increasingly important, with wireless systems finding their way into every growing numbers of applications. Wireless systems are become ubiquitous in the military environment. Wireless systems often include a number of terminals which can communication with each other in various network topologies. One issue is managing transmissions so that terminals do not interference with each other (or other wireless systems which may share the same frequency bands).

Many wireless communications systems use so-called frequency division multiple access, wherein different slices of spectrum (channels) are allocated to individual terminals for their transmissions. Higher data rate transmissions generally require larger allocations of bandwidth are typically required. The supply of available bandwidth for a communication system is typically limited; hence, efficient use of the bandwidth is desirable. Accordingly, there is a desired for flexibility in the use of bandwidth within communications systems. While some types of so-called bandwidth on demand systems have been implemented, performance of such systems has not always been as high as desired.

SUMMARY

In some embodiments of the invention, a spectral sensing demodulator is provided. The spectral sensing demodulator can include a programmable filter bank. The programmable filter bank can frequency demultiplex a plurality of frequency division multiplexed channels into a plurality of demultiplexed channels. The frequency division multiplexed channels can be in a frequency band. The programmable filter bank can be programmable to specify a number of demultiplexed channels and a bandwidth of each demultiplexed channel. The spectral sensing demodulator can also include a reconfigurable processor coupled to the programmable filter bank. The reconfigurable processor can include a plurality of reconfigurable resources. Each resource can be alternatively configured to either demodulate a demultiplexed channel or to monitor a demultiplexed channel.

BRIEF DESCRIPTION OF THE DRAWINGS

Additional features and advantages of the invention will be apparent from the detailed description that follows, taken in conjunction with the accompanying drawings, that together illustrate, by way of example, features of the invention; and, wherein.

DETAILED DESCRIPTION

Figure 1:
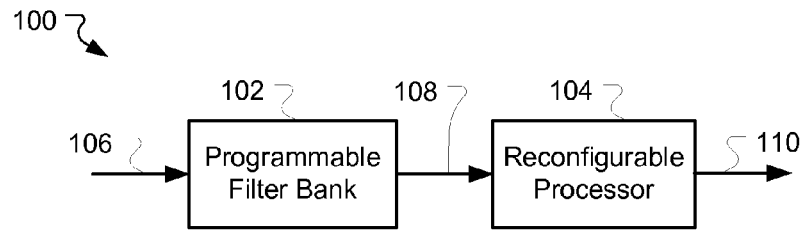
FIG. 1 is a block diagram of a spectral sensing demodulator in accordance with some embodiments of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing the present invention, the following terminology will be used:

The singular forms "a," "an," and "the" include plural referents unless the context clearly dictates otherwise. Thus, for example, reference to an item includes reference to one or more of said item.

The term "ones" refers to one, two, or more, and generally applies to the selection of some or all of a quantity. The term "plurality" refers to two or more of an item.

As used herein, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art.

As used herein, the term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described.

As used herein, a plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items.

As used herein, the term "alternatively" refers to selection of one of two or more alternatives, and is not intended to limit the selection to only those listed alternatives or to only one of the listed alternatives at a time, unless the context clearly indicates otherwise.

Turning to FIG. 1, a spectral sensing demodulator system is illustrated in accordance with some embodiments of the present invention. The system, shown generally at 100, can include a programmable filter bank 102 and a reconfigurable processor 104. The programmable filter bank can accept an input signal 106 which comprises a plurality of frequency multiplexed channels within a frequency band. The programmable filter bank can demultiplex the frequency multiplexed channels into a programmable number of channels having a programmable bandwidth for each channel. For example, as will be explained in further detail below, the programmable filter bank can demultiplex some or all of the frequency multiplexed channels within the frequency band. The channels can have the same bandwidth as each other or can have different bandwidths from each other. Various examples of programmable filter banks are illustrated further below.

The demultiplexed frequency channels 108 can be provided to the reconfigurable processor 104. For example, in some embodiments, the demultiplexed channels may be provided from the programmable filter bank 102 to the reconfigurable processor 104 in a sampled, digitized format. The reconfigurable processor can include a plurality of processing resources, examples of which are provided further below. The resources can be alternatively configured to either demodulate or to monitor one of the demultiplexed channels. For example, during operation, a processing resource can be configured to demodulate a first demultiplexed one of the frequency division multiplexed channels. During operation, the processing resource can later be reconfigured to monitor a second demultiplexed one of the frequency division multiplexed channels (which can be the same or different from the first one). Later, the processing resource can be reconfigured again to demodulate. Output 110 can be provided from the reconfigurable processor. The output can correspond to demodulated data (obtained from demodulators), spectral sensing information (obtained from monitors), or both.

Figure 2:
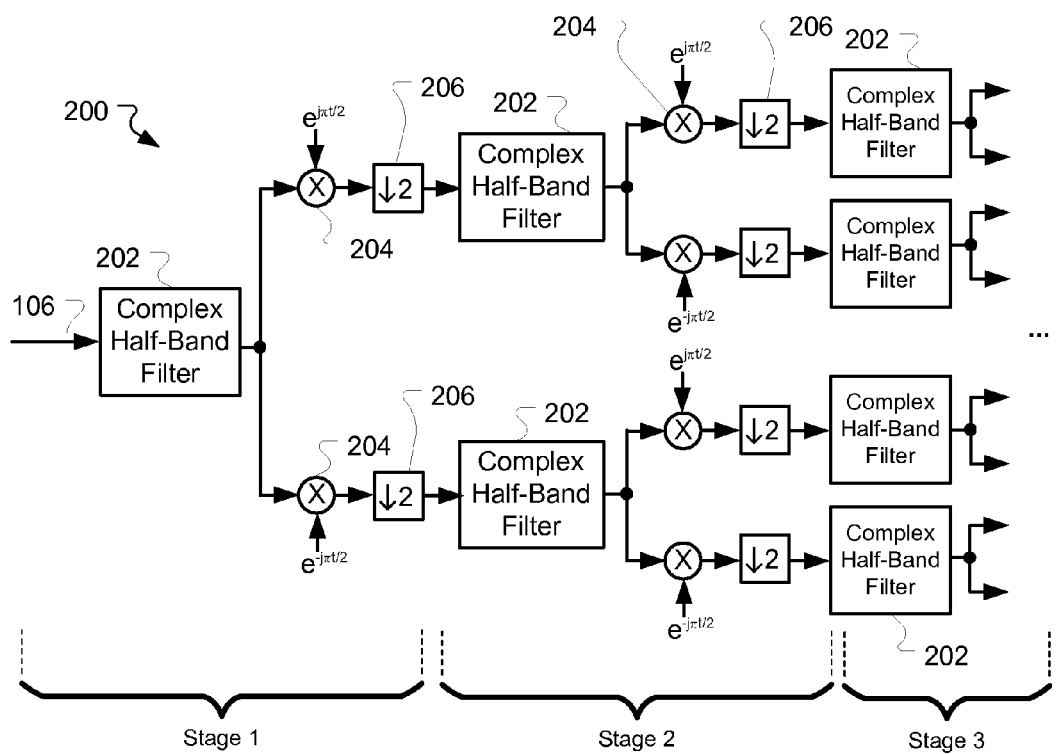
FIG. 2 is a block diagram of one example of a programmable filter bank which can be used in the spectral sensing demodulator of FIG. 1 in accordance with some embodiments of the present invention.

Various means of demultiplexing the frequency division multiplexed channels can be provided by the programmable filter bank 102. For example, in some embodiments, the programmable filter bank can include a half-band tree structure formed using a plurality of cascaded half band filters. For example, FIG. 2 illustrates a half-band tree 200 of cascaded half band filters 202 which, in some embodiments, can provide the programmable filter bank 102. The half-band tree can include a number of stages (three are illustrated, but the number of stages is not limited to this particular value). Each stage can include one or more complex half-band filters, one or more down-converters 204, and one or more down-samplers 206. Each of the half band filters can reduce the bandwidth by one half, with resulting bands are centered at frequencies of $\pm\pi/2$. Down-conversion to baseband is thus provided by multiplying by $e^{\pm j\pi t/2}$. The down-converters can be relatively straightforward, since the multiplication by $e^{\pm j\pi t/2}$ can be implemented by a swap of the real and imaginary portions. Since the bandwidth has been reduced by one half, down-sampling by a factor of two can also be included after the down-conversion. Each subsequent stage thus reduces the bandwidth by another factor of two, while doubling the number of channels available. Accordingly, any desired number of stages can be used to provide the desired bandwidth and number of channels. If desired, outputs can be tapped off before the last stage of the tree to provide wider bandwidth channels.

For example, for an input signal bandwidth of about 204.8 MHz, ten stages can be provided, resulting in a minimum channel bandwidth of 200 kHz. Thus, a total 1024 channels at the minimum channel bandwidth of 200 kHz can be provided at the output of the tenth stage. If desired, one or more wider bandwidth channels can be taken from the output of the ninth stage, in which case a bandwidth of 400 kHz for the channels is provided. Similarly, outputs can be taken from any stage, to provide any combination of channel bandwidths chosen from the set of {200 kHz, 400 kHz, 800 kHz, 1.6 MHz, ... 102.4 MHz}. Moreover, when a higher bandwidth channel is used, it is not necessary to perform the subsequent half-band filters or down-conversions following that channel.

Figure 3:
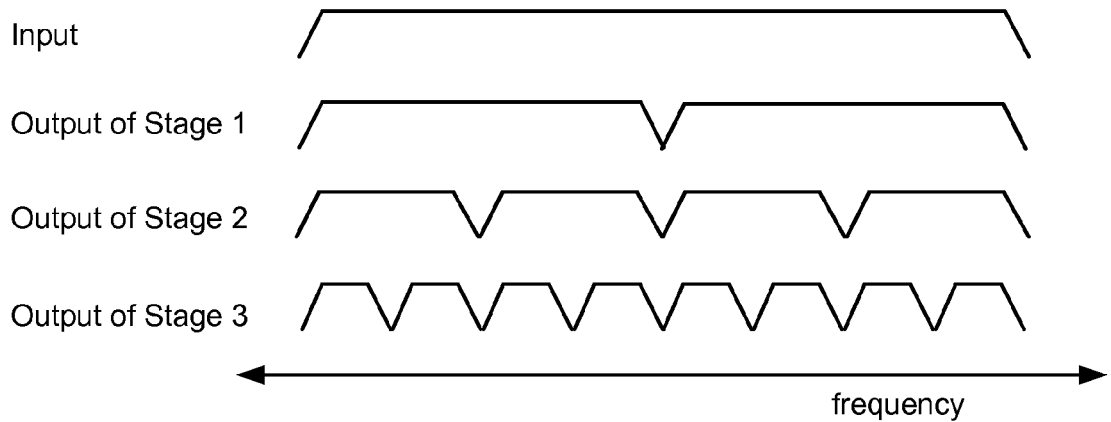
FIG. 3 is a graph of one example of frequency bands demultiplexed by a programmable filter bank in accordance with some embodiments of the present invention.

FIG. 3 provides an illustration of the channel bandwidths at the outputs of the various stages (showing the input frequencies for each band) for a complete tree. Note, however, that the outputs of each stage can be down-converted to baseband. Thus the programmable filter bank can provide a separately selected bandwidth for each channel, wherein each of the selected bandwidths can be any one of a plurality of pre-defined bandwidth options. If desired, parts of the tree can be omitted when wider bandwidth channels are used. For example, the outputs of stage 1 correspond to channels having half the bandwidth of the frequency band. The outputs of stage 2 provide channels having one quarter the bandwidth of the frequency band. If desired, a portion of stage 2 can be omitted to provide one channel covering half the frequency band (taking the output directly from stage 1). Similarly, the outputs of stage 3 provide channels having one eighth the frequency band. If desired, one or more sections of stage 3 can be omitted to provide channels covering one quarter the frequency band (taking the output(s) directly from stage 3). Similarly, for additional stages, one or more sections can be omitted to provide wider bandwidth channels.

Figure 4:
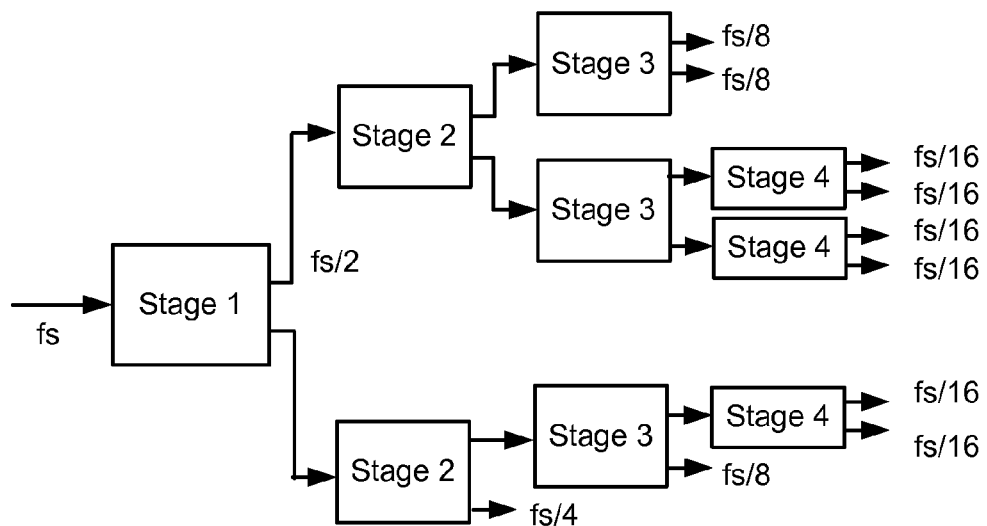
FIG. 4 is a block diagram of a programmable filter bank configured to provide several channels of different bandwidths in accordance with some embodiments of the present invention.

For example, FIG. 4 provides an illustration of one example of using a mixture of channel bandwidths. An input signal have a sample rate of fs is processed by Stage 1 to yield two channels at a sample rate of fs/2. These channels are processed by two portions of Stage 2 to yield four channels at a sample rate of fs/4. One channel (at the bottom) is used. The other three channels are processed by Stage 3 portions the yield channels at a sample rate of fs/8. Two channels are output from Stage 3 while remaining channels are processed by Stage 4 to yield channels with a sample rate of fs/16.

If desired, the programmable filter bank can be reconfigured during operation. For example, the wireless communication system can include means for reallocating channels (e.g., dedicated communications channels used for transmitting configuration messages, requests for bandwidth, etc.) which can be used to communicate channel assignments to terminals. The programmable filter bank can be reconfigured to accommodate changing channel assignments by adding or deleting stages as needed. For example, to provide additional channels at the sample rate of fs/16, additional sections of Stage 4 may be provided. As another example, the provide an additional channel at the sample rate of fs/4, output can be taken from Stage 2 and one or more sections of Stage 3 and Stage 4 can be deleted. Reconfiguring the programmable filter bank can be accomplished by reconfiguring programmable logic blocks within a field programmable gate array.

While half band filters have been described, other types of filters can be used. In some embodiments the filters can be quadrature mirror filters. The filters can be finite impulse response or infinite impulse response filters. The filters can be implemented in any suitable form (e.g., direct form, transverse form, cascaded filters, etc.). If desired, the filters can be implemented in a polyphase form wherein downsampling is integrated into the filter.

Returning to FIG. 1, the reconfigurable processor 104 can provide various means for processing the plurality of demultiplexed channels. In some embodiments, the reconfigurable processor can include a plurality of reconfigurable processing resources. In some embodiments, the reconfigurable processor can include a field programmable gate array wherein programmable logic blocks provide reconfigurable processing resources. The field programmable gate array can be reprogrammed during operation to reconfigure portions or the entire device. For example, logic blocks which have been programmed to implement a demodulator can be reprogrammed to implement a spectral monitor. Logic blocks within the field programmable gate array can be operationally reconfigured to alternatively operate as a demodulator or to operate as a spectral monitor. In some embodiments, the reconfigurable processor can be programmable digital signal processor. For example, processor executable instructions can program the digital signal processor to perform operations to implement a demodulator and a spectral monitor. The digital signal processor can include one or more processing cores. Reconfiguring the processor can be accomplished by causing the processor to execute different instructions. For example, modules can be provided for one or more demodulation algorithms and modules can be provided for one or more monitoring algorithms, for example as described further below.

In some embodiments, the demodulator can accept baseband input signals, and perform any of amplitude, phase, and frequency demodulation to extract decision data. The decision data can be, for example, hard decision data (e.g., bits or data symbols). As another example, the decision data can be soft decision data (e.g., confidence values associated with symbol hypotheses). The decision data can, if desired, be processed by interleaving and error correction decoding to produce decoded data. For example, various types of interleaving can be used including block, convolutional, and hybrid interleaving. Various types of error correction coding can be used including convolutional, block, and turbo coding. The decision data and/or decoded data can be output from the reconfigurable processor.

Figure 5A:
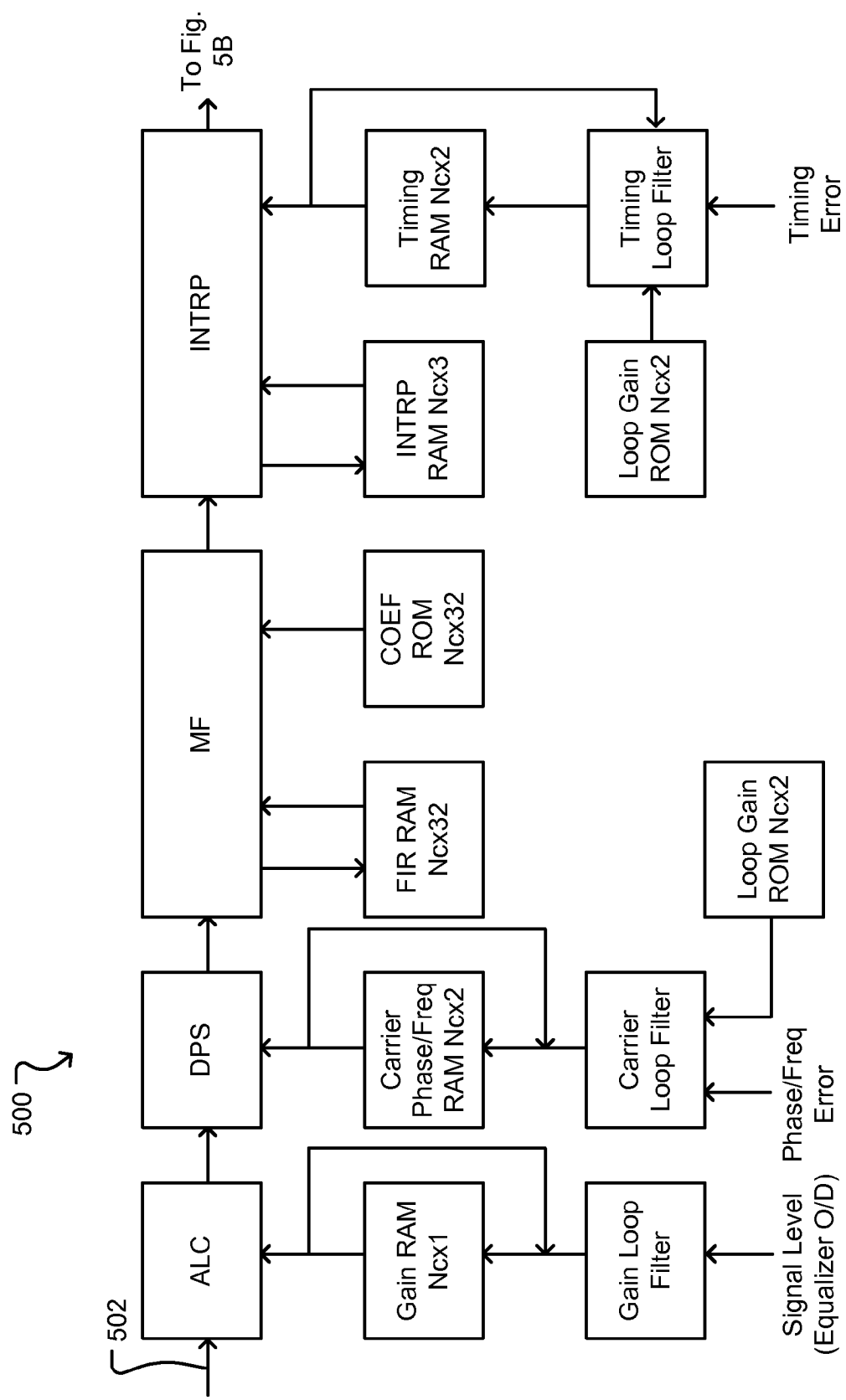
FIG. 5A and FIG. 5B are a block diagram of a demodulator than can be implemented by a reconfigurable processor in accordance with some embodiments of the present invention.
Figure 5B:
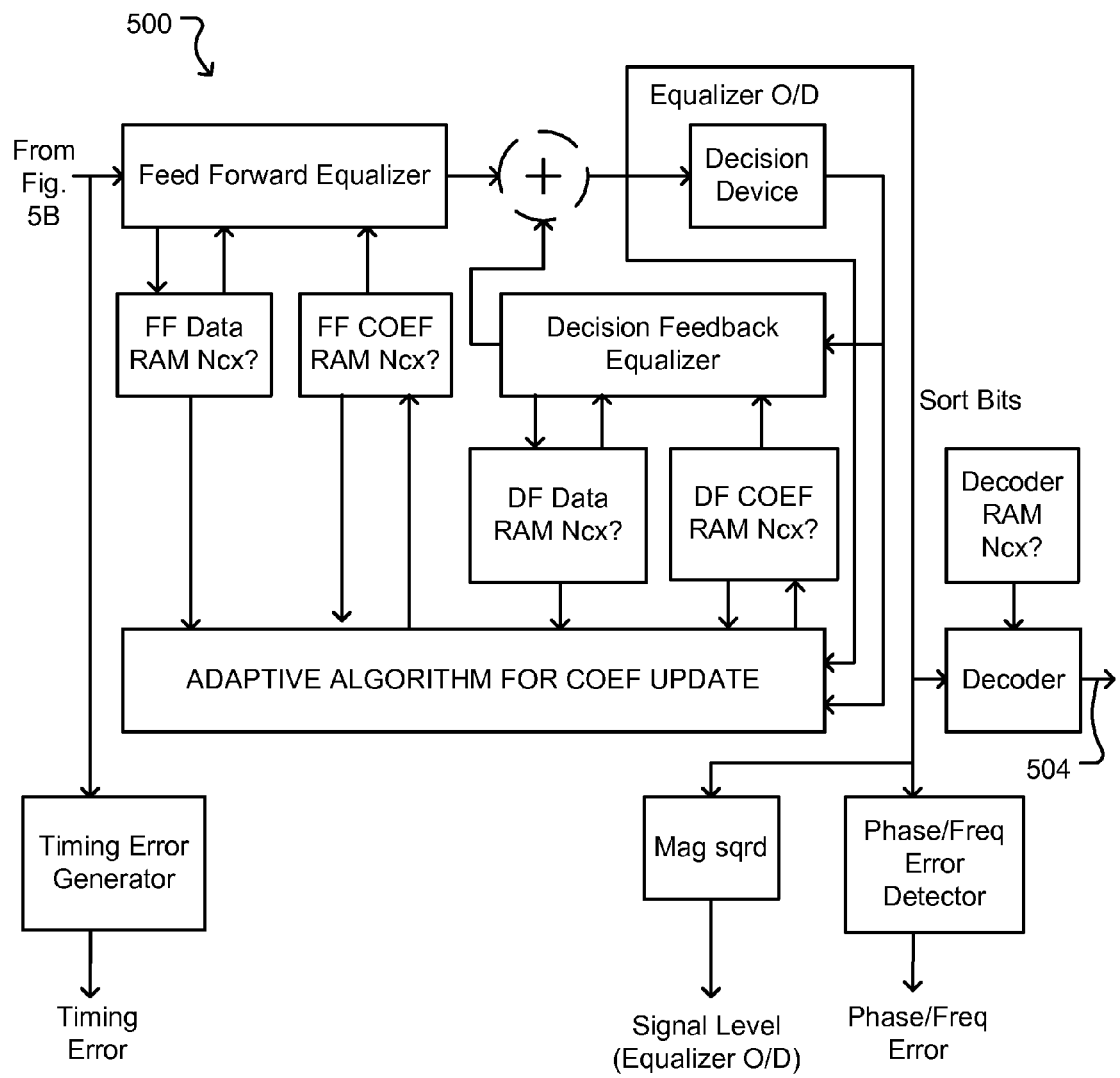

For example FIG. 5A and FIG. 5B illustrate one embodiment of a demodulator than can be implemented by the reconfigurable processor. The demodulator 500 (which is shown in part in FIG. 5A and in part in FIG. 5B) can accept the demultiplexed channel input 502. The input can be processed by an automatic level control (ALC) circuit to normalize the signal level and then processed by a digital phase shifter (DPS) to remove residual frequency/phase error (e.g., due to Doppler). The resulting signal can be matched filtered using a matched filter (MF) to provide matched filter data. If desired, an interpolation (INTRP) block can be included to perform interpolation or re-sampling (sample rate changing). For example, fractional decimation can be performed. Adaptive forward and backward equalization can be provided. The resulting soft decision data can be provided to a decoder to obtain hard decision data. Various types of decoders can be used, including for example block decoding, convolutional deciding, and turbo decoding. Although not shown, a de-interleaver can also be included. The demodulator can output the hard decision data 504.

Various other arrangements of a demodulator can be used as well. For example, one or more matched filters can be included to correlate the input signal against a plurality of reference symbols. Either or both of the forward and backward equalization can be omitted. The decoder can be omitted, or multiple decoders can be included in parallel or series configurations.

As discussed above, the demodulator can be implemented using programmable resources. Hence, the demodulator can be reconfigured to accommodate different signal formats during operation. In addition, the programmable resources can also be reconfigured during operation for monitoring. Various types of spectral monitoring can be used. For example, the spectral monitor can be any of an energy detector, a structure detector, and an imperfection detector. For example, various types of energy detectors are known which can be efficiently implemented in digital electronics hardware, including for example, a basic radiometer, a Dicke radiometer, and the like. More complex radiometers can be used as well, for example a radiometer which performs correlation using two or more antennas.

Figure 6:
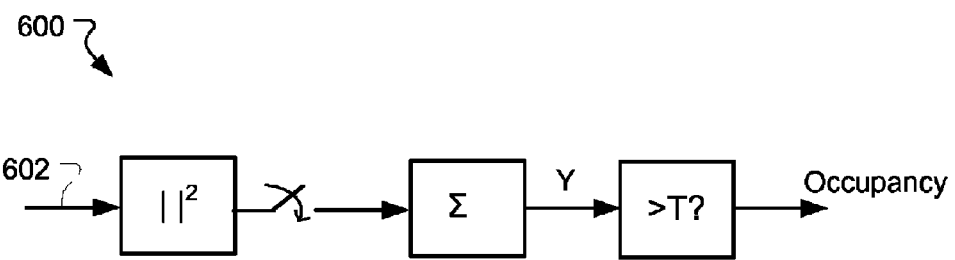
FIG. 6 is a block diagram of a monitor than can be implemented by a reconfigurable processor in accordance with some embodiments of the present invention.

FIG. 6 illustrates one example of radiometer 600. The demultiplexed channel is provided as input 602 to the radiometer. The input is squared, sampled, and integrated (summed) to provide an output statistic, Y. The integration (summation) period can be set to any desired interval. The output statistic can be used (e.g., as a measure of noise or energy level) or can be further processed. For example, the output statistic can be compared to a threshold to determine occupancy of the channel.

Figure 7:
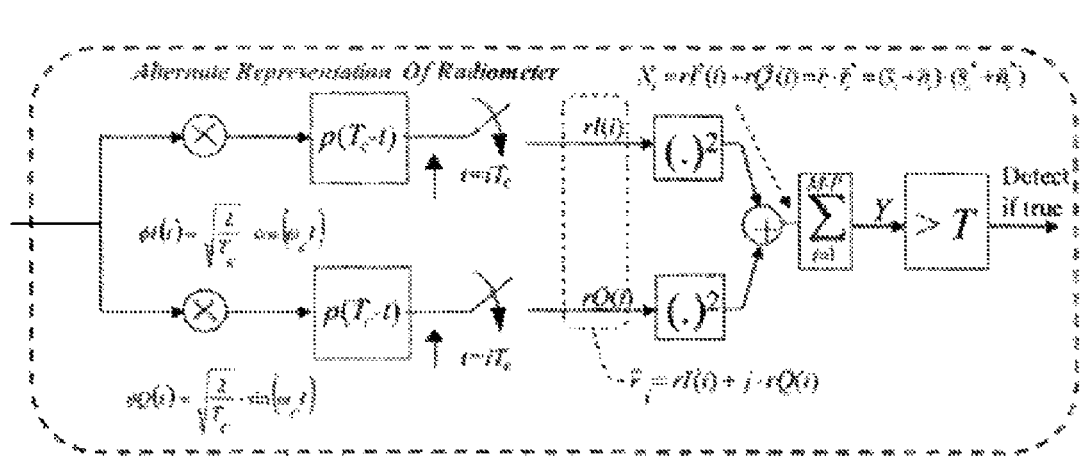
FIG. 7 is a block diagram of another monitor than can be implemented by a reconfigurable processor in accordance with some embodiments of the present invention.

FIG. 7 illustrates another example of radiometer 700 which can process complex input. The input can be frequency shifted by mixers (multipliers), filtered, and sampled. The sampled inphase and quadrature components can be squared and added to form a magnitude. The magnitude can be integrated (summed) and compared to a threshold in a similar manner to FIG. 6.

Various types of structure detectors can be used as well, including for example frequency hop structure detectors (e.g., swept radiometers, AC radiometer, hop rate detector, partial band filter bank combiners, and the like), direct sequence structure detectors (e.g., quadratic and higher order detectors), and ultrawideband detectors. Imperfection detectors can be designed to look for spurious emissions (e.g., local oscillator bleed through, harmonic signals, period spectral lines, and the like).

Mapping between the processing resources and the demultiplexed channels can vary and can be operationally reconfigured. For example, wider bandwidth channels generally require a greater amount of processing resource for demodulation or spectral monitoring. For example, consider a non-limiting example of processing a frequency band of 160 MHz. Up to 32 channels of 5 MHz can be provided, or as discussed above, a lesser number of channels with bandwidths at any of 5 MHz, 10 MHz, 20 MHz, 40 MHz and 80 MHz. The reconfigurable processor can be partitioned to provide 32 groups of processing resources, numbered 1 to 32 for convenience. A single group of processing resource can process a 2.5 MHz channel, while two groups can process a 5 MHz channel, etc. Accordingly, a number of different modes of operation can be provided as summarized in the below table:

| Mode | Channel Bandwidths (MHz) | Resource Assignment |
|---|---|---|
| 1 | 80-80 | 1-16 17-32 |
| 2 | 80-40-40 | 1-16 17-24 25-32 |
| 3 | 80-40-20-20 | 1-16 17-24 25-28 28-32 |
| 4 | 80-40-20-10-10 | 1-16 17-24 25-28 29-30 31-32 |
| 5 | 80-40-20-10-5-5 | 1-16 17-24 25-28 29-30 31 32 |
| 6 | 80-40-20-5-5-10 | 1-16 17-24 25-28 28 30 31-32 |
| 7 | 80-40-20-5-5-5-5 | 1-16 17-24 25-28 29 30 31 32 |
| 8 | 80-40-10-10-20 | 1-67 17-24 25-26 27-28 29-32 |
| ... | | |
| N | 5-5-5-5-5-5-5-5-5-5-5-5-5-5-5 | 1 2 3 ... 32 |

As can be seen from the above table, a large number of different combinations are possible. As discussed above, the processing resources can be reconfigured to operate in any one of the different modes to match the particular arrangement of demultiplexed frequency channels in use.

In accordance with some embodiments of the invention, processing resources that are allocated to a demultiplexed channel can be configured for demodulation when the assigned channel is occupied. In other words, when there is a signal present to be demodulated, the processing resources can be configured to demodulate the signal to extract data encoded within the signal. Conversely, processing resources that are allocated to a demultiplexed channel that is unoccupied (or unassigned) can be configured for spectral monitoring. Reconfiguration between demodulation and spectral monitoring can occur as needed (e.g., as a channel is allocated or deallocated for data transmission). If desired, demodulators can be reconfigured for spectral monitoring during breaks in data transmission (e.g., between bursts). If channel bandwidths change, processing resources can also be reconfigured (e.g., a group of resources may be reassigned to one or more channels having reduced bandwidth, or conversely two or more groups of resources may be reassigned to a higher bandwidth channel than they were previously processing).

The spectral monitoring can be used to determine a noise level, spectral occupancy, or other parameters of the assigned allocated channel. For example, a radiometer can provide an estimate of noise level or occupancy of a channel. As another example, a spectrum analyzer can provide an estimate of the noise level or occupancy of the channel. The information produced by the spectral monitors can be referred to as spectral sensing information. Accordingly, the spectral sensing demodulator can be used to provide a greater awareness of the wireless environment in which a terminal is operating.

Figure 8:
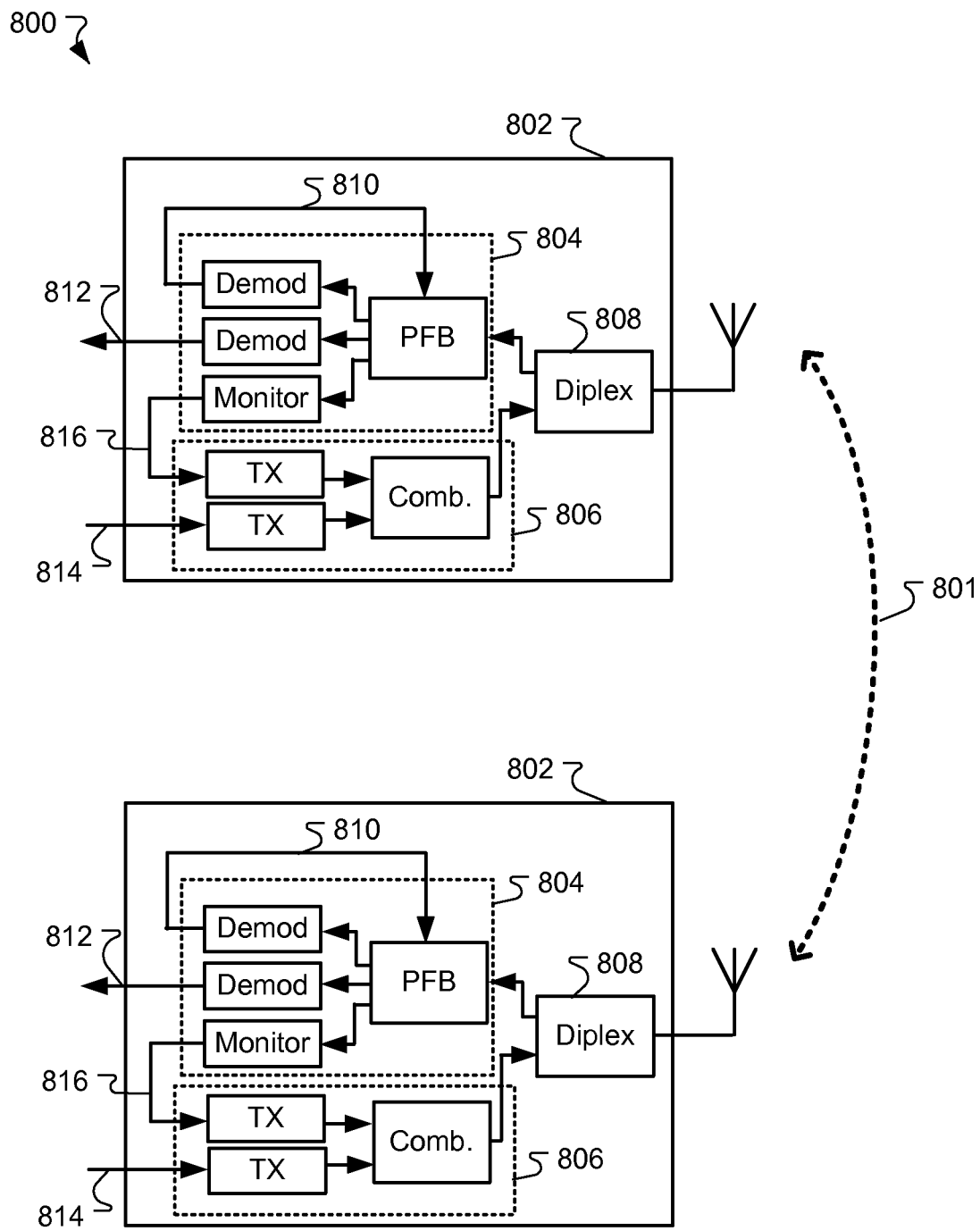
FIG. 8 is a block a diagram of a wireless communications system in accordance with some embodiments of the present invention.

A spectral sensing demodulator can be included in a wireless terminal in accordance with some embodiments of the invention. Spectral sensing information produced by the spectral sensing demodulator can be shared with other spectral sensing demodulators of other wireless terminals. For example, FIG. 8 illustrates a wireless communications system 800 which includes a plurality of terminals 802 having spectral sensing demodulators 804. Although two terminals are shown, the network can include two or more terminals. The terminals can communicate through a wireless channel 801. Not all terminals need be in communication with each other, and various network topologies can be used (e.g., hub-and-spokes, mesh, partially connected mesh, and hybrid configurations).

The spectral sensing demodulators 804 can include a programmable filter bank (PFB) and processing resources, which can be configured to provide demodulators (Demod) and/or spectral monitors (Monitor), for example as described above.

The terminals 802 can also include a transmission subsystem 806, which can include one or more transmitters (TX). The transmission subsystem and spectral sensing demodulator 804 can be combined into a single antenna for wireless transmission/reception using a diplexer or duplexer 808.

In some embodiments, one or more frequency division multiplexed channels can be used for managing the wireless system 800. For example, one or more of the demodulators can be assigned to an order wire or command channel and receive information 810 defining the channel configurations (e.g. transmitted by another wireless terminal). The information can be provided to the programmable filter bank to allow programming the filter bank. As another example, one or more of the demodulators can receive spectral sensing information from other terminals as will become clearer from the below discussion.

Demodulators can be used for receiving communication data 812 (e.g. transmitted from another wireless terminal), which can be output from the wireless terminal 802. A transmitter can be used for transmitting communication data 814 (e.g. transmitted to another wireless terminal) which has been input to the wireless terminal.

The monitor can be used to determine spectral sensing information 816. For example, the spectral sensing information can be used by the wireless terminal 802 to make changes in its operation (e.g., changing demodulator type, changing transmission formats, etc.). For example, the spectral sensing information can be provided to a processor (not shown) in the wireless terminal which can in turn control the operation of the terminal (e.g., configuring/reconfiguring demodulators, monitors, filter banks, etc.).

Various means for sharing spectral sensing information with other wireless terminals can be provided. For example, a frequency division multiplexed channel can be allocated for communication of the spectral sensing information between terminals. Wireless terminals can use one of the transmitters of the transmission subsystem 806 to transmit the spectral sensing information on the allocated channels (the spectral sensing information can thus be received by demodulators of other spectral sensing demodulators in other terminals). As another example, the spectral sensing information 814 can be multiplexed with the communication data 814 transmitted by the terminal (and similarly received by other terminals).

Figure 9:
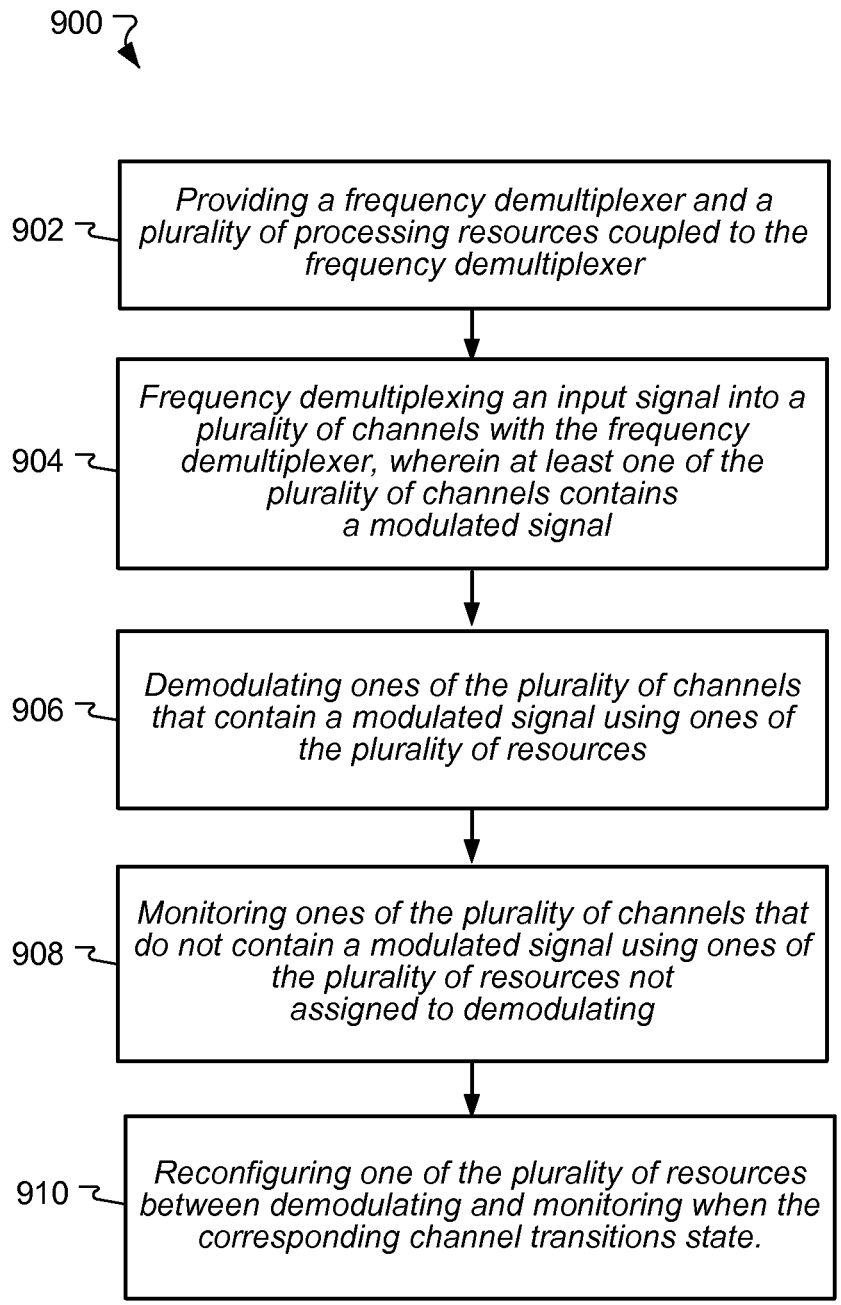
FIG. 9 is a flow chart of a method for spectral sensing demodulation in accordance with some embodiments of the present invention.

Turning to FIG. 9, a flow chart of a method for spectral sensing demodulation is illustrated in accordance with some embodiments of the present invention. The method, shown generally at 900, can include providing 902 a frequency demultiplexer and a plurality of processing resources coupled to the frequency demultiplexer. The frequency demultiplexer can provide a means for demultiplexing a frequency band into a plurality of demultiplexed frequency channels as described above. For example, the frequency demultiplexer can be a programmable filter bank as described above. The plurality of processing resources can provide a means for processing a plurality of channels as described above. For example, the plurality of processing resources can be provided by a reconfigurable processor.

The method 900 can also include frequency demultiplexing 904 an input signal into a plurality of channels with the frequency demultiplexer. For example, as described above, the channels can correspond to frequency division multiplexed channels within a frequency band. The channels need not have the same bandwidth as each other. Each of the channels can be unoccupied or occupied. For example, some of the plurality of channels can contain a modulated signal. As discussed above, the frequency demultiplexer can be reconfigurable to allow changing either the number of channels, changing the bandwidth of one or more channels, and changing both the number and bandwidth of channels.

Another operation in the method 900 can be demodulating 906 ones of the plurality of channels that contain a modulated signal using ones of the plurality of processing resources. For example, as described above, some of the processing resources can be configured to demodulate the modulated signal present in the channel and extract information encoded into the modulated signal.

The method 900 can also include monitoring 908 ones of the plurality of channels that do not contain a modulated signal using ones of the plurality of processing resources not assigned to demodulating. For example, as described above, some of the processing resources can be configured to spectrally monitor channels. The processing resources can obtain information about the channel, such as noise level, occupancy, signal characterization, and the like. The processing resources that are not being used to demodulate can be used for spectral monitoring.

The processing resources can be reconfigured between demodulating and spectral monitoring as the needs change. For example, in some embodiments, the method 900 can include reconfiguring 810 one of the plurality of processing resources from demodulating to monitoring when the corresponding channel transitions from containing a modulated signal to not containing a modulated signal. Conversely, the method can include reconfiguring one of the plurality of processing resources from monitoring to demodulating when the corresponding channel transitions from not containing a modulated signal to containing a modulated signal. In general, the method can thus include reconfiguration one of the plurality of processing resources between demodulating and modulating as the corresponding channel state changes between occupied and unoccupied.

In addition to transitioning between demodulation and monitoring, channel resources can also be reconfigured for different channels. For example, as the number of channels, bandwidth of channels, or both, are changed, the processing resources can be reconfigured to accommodate the changed number of channels and bandwidths. For example, a single processing resource may be assigned to a narrow bandwidth channel, and multiple processing resources may be assigned to a wide bandwidth channel. Assignments between processing resources and channel can be changed as needed, due to change in occupancy of channels, change in number of channels, and change in the bandwidth of channels. If desired, periodic changes in the assignments of processing resources to channels or type of processing performed can be made. For example, in some embodiments, a set of n occupied channels can be periodically rotated amount a set of m channels (n<m), so that each of the m channels is, at least part of the time, unoccupied. When each of the m channels is unoccupied, the corresponding processing resources can be configured for spectral monitoring, allowing the channel to be characterized.

Spectral sensing information can be used for enhanced cognitive radio performance. As discussed above, spectral sensing information can be shared within a network. This can enable enhanced performance within a cognitive radio network, as the spectral sensing information obtained at each terminal is local to that terminal. Thus, sharing of spectral sensing information across multiple terminals can allow for a more accurate assessment of network wide conditions.

While several illustrative applications have been described, many other applications of the presently disclosed techniques may prove useful. Accordingly, the above-referenced arrangements are illustrative of some applications for the principles of the present invention. It will be apparent to those of ordinary skill in the art that numerous modifications can be made without departing from the principles and concepts of the invention as set forth in the claims.

What is claimed is:

1. A spectral sensing demodulator comprising:
   a programmable filter bank configured to frequency demultiplex a plurality of frequency division multiplexed channels from a frequency band into a plurality of demultiplexed channels, wherein the programmable filter bank is programmable to specify a number of demultiplexed channels and a bandwidth of each demultiplexed channel;
   a reconfigurable processor coupled to the programmable filter bank, the reconfigurable processor comprising:
      a plurality of reconfigurable resources, wherein each resource can be alternatively configured (i) to demodulate a demultiplexed channel and (ii) to monitor a demultiplexed channel.

2. The spectral sensing demodulator of claim 1, wherein the programmable filter bank comprises a plurality of cascaded half band filters.

3. The spectral sensing demodulator of claim 1, wherein each channel has a separately selected bandwidth chosen from a plurality of predefined bandwidth options.

4. The spectral sensing demodulator of claim 1, wherein the reconfigurable processor comprises a field programmable gate array.

5. The spectral sensing demodulator of claim 1, wherein each of the reconfigurable resources is configured to be switched between:
   a first state in which the reconfigurable resource is configured to demodulate a modulated signal on one of the demultiplexed channels to which the reconfigurable resource is allocated, and
   a second state in which the reconfigurable resource is configured to monitor the one of the demultiplexed channels to which the reconfigurable resource is allocated.

6. The spectral sensing demodulator of claim 5, wherein each of the reconfigurable resources is further configured to be allocated to any of the demultiplexed channels.

7. The spectral sensing demodulator of claim 6, wherein the reconfigurable processor is configured to switch one of the reconfigurable resources from the second state to the first state upon the one of the reconfigurable resources detecting on the one of the demultiplexed channels to which the one of the reconfigurable resources is allocated a transition from a lack of a demodulated signal to a presence of a demodulated signal.

8. The spectral sensing demodulator of claim 6, wherein the reconfigurable processor is configured to switch one of the reconfigurable resources from the first state to the second state upon the one of the reconfigurable resources detecting on the one of the demultiplexed channels to which the one of the reconfigurable resources is allocated a transition from a presence of a demodulated signal to a lack of a demodulated signal.

9. The spectral sensing demodulator of claim 6, wherein the reconfigurable processor is configured to:
- allocate each of the reconfigurable resources to any of the demultiplexed channels, and
- put a first plurality of the reconfigurable resources in the first state, and
- put a second plurality of the reconfigurable resources in the second state.

10. The spectral sensing demodulator of claim 6, wherein the reconfigurable processor is configured to:
- change the demultiplexed channel to which each of the reconfigurable resources is allocated, and
- switch each of the reconfigurable resources between the first state and the second state.

11. The spectral sensing demodulator of claim 5, wherein in the first state, each said reconfigurable resource is configured to demodulate a modulated signal on the one of the demultiplexed channels to which the reconfigurable resource is allocated.

12. The spectral sensing demodulator of claim 5, wherein in the first state, each said reconfigurable resource is configured to extract data from a modulated signal on the one of the demultiplexed channels to which the reconfigurable resource is allocated.

13. The spectral sensing demodulator of claim 5, wherein in the second state, each said reconfigurable resource is configured to characterize a noise level on the one of the demultiplexed channels to which the reconfigurable resource is allocated.

14. The spectral sensing demodulator of claim 5, wherein in the second state, each said reconfigurable resource is configured to detect a signal on the one of the demultiplexed channels to which the reconfigurable resource is allocated.

15. The spectral sensing demodulator of claim 14, wherein in the second state, each said reconfigurable resource is further configured to characterize a type of the signal detected on the one of the demultiplexed channels to which the reconfigurable resource is allocated.

16. The spectral sensing demodulator of claim 5, wherein in the second state, each said reconfigurable resource is further configured to characterize an occupancy of the one of the demultiplexed channels to which the reconfigurable resource is allocated.

17. The spectral sensing demodulator of claim 5, wherein in the second state, each said reconfigurable resource is configured to monitor for a modulated signal the one of the demultiplexed channels to which the reconfigurable resource is allocated.

18. The spectral sensing demodulator of claim 1 further comprising a transmitter configured to share with another spectral sensing demodulator information about one or more of the demultiplexed channels obtained from one or more of the reconfigurable resources in the second state.

19. The spectral sensing demodulator of claim 18, wherein the transmitter is a wireless transmitter.

20. The spectral sensing demodulator of claim 1, wherein the reconfigurable processor is configured to reconfigure one of the reconfigurable resources from monitoring one of the demultiplexed channels to demodulating a modulated signal on the one of the demultiplexed channels upon detecting the modulated signal as a new signal on the one of the demultiplexed channels.

* * * * *